(12) United States Patent
Buschbeck et al.

(10) Patent No.: US 8,049,189 B2
(45) Date of Patent: Nov. 1, 2011

(54) CHARGED PARTICLE SYSTEM

(75) Inventors: Herbert Buschbeck, Vienna (AT);
Elmar Platzgummer, Vienna (AT);
Gerhard Stengl, Wernberg (AT);
Herbert Vonach, Klosterneuburg (AT)

(73) Assignee: Carl Zeiss SMS GmbH, Jena (DE)

( * ) Notice: Subject to any disclaimer, the term of this patent is extended or adjusted under 35 U.S.C. 154(b) by 296 days.

(21) Appl. No.: 12/090,636

(22) PCT Filed: Oct. 20, 2006

(86) PCT No.: PCT/EP2006/010158
§ 371 (c)(1),
(2), (4) Date: Apr. 17, 2008

(87) PCT Pub. No.: WO2007/045501
PCT Pub. Date: Apr. 26, 2007

(65) Prior Publication Data
US 2008/0210887 A1    Sep. 4, 2008

(30) Foreign Application Priority Data
Oct. 20, 2005  (EP) .................................... 05022915

(51) Int. Cl.
*G21K 1/00*  (2006.01)
(52) U.S. Cl. ............. 250/492.22; 250/492.1; 250/492.2; 250/492.21; 250/492.3
(58) Field of Classification Search ............... 250/492.1, 250/492.2, 492.21, 492.22, 492.3
See application file for complete search history.

(56) References Cited

U.S. PATENT DOCUMENTS

| | | | |
|---|---|---|---|
| 3,937,959 | A | 2/1976 | Namae |
| 4,134,014 | A | 1/1979 | Neave et al. |
| 4,926,054 | A | 5/1990 | Frosien |
| 4,978,856 | A | 12/1990 | Akado |
| 5,216,235 | A | 6/1993 | Lin |
| 5,557,105 | A | 9/1996 | Honjo et al. |
| 6,465,781 | B1 | 10/2002 | Nishimura et al. |
| 6,521,891 | B1 | 2/2003 | Dotan et al. |
| 6,661,015 | B2 | 12/2003 | Chalupka et al. |
| 7,482,586 | B2 | 1/2009 | Ishitani et al. |
| 7,521,677 | B2 | 4/2009 | Walter et al. |
| 7,915,581 | B2 | 3/2011 | Ishitani et al. |
| 2004/0084621 | A1 | 5/2004 | Kienzle et al. |

(Continued)

FOREIGN PATENT DOCUMENTS
EP  0 762 458  A1  3/1997
(Continued)

*Primary Examiner* — Robert Kim
*Assistant Examiner* — Hanway Chang
(74) *Attorney, Agent, or Firm* — Bruce D Ritter

(57) ABSTRACT

A charged particle system comprises a particle source for generating a beam of charged particles and a particle-optical projection system. The particle-optical projection system comprises a focusing first magnetic lens (403) comprising an outer pole piece (411) having a radial inner end (411'), and an inner pole piece (412) having a lowermost end (412') disposed closest to the radial inner end of the outer pole piece, a gap being formed by those; a focusing electrostatic lens (450) having at least a first electrode (451) and a second electrode (450) disposed in a region of the gap; and a controller (C) configured to control a focusing power of the first electrostatic lens based on a signal indicative of a distance of a surface of a substrate from a portion of the first magnetic lens disposed closest to the substrate.

19 Claims, 4 Drawing Sheets

U.S. PATENT DOCUMENTS

| | | | |
|---|---|---|---|
| 2004/0105160 A1* | 6/2004 | Kienzle et al. | 359/619 |
| 2005/0072933 A1* | 4/2005 | Stengl et al. | 250/396 R |
| 2005/0139789 A1* | 6/2005 | Nagano et al. | 250/492.23 |

FOREIGN PATENT DOCUMENTS

| | | |
|---|---|---|
| EP | 1081741 A2 | 3/2001 |
| EP | 1 389 797 A2 | 2/2004 |
| EP | 1 530 229 A1 | 5/2005 |
| GB | 2 125 614 A | 3/1984 |
| JP | 56112059 A | 9/1981 |
| JP | 07245075 A | 9/1995 |
| WO | WO 02/14955 A1 | 2/2002 |
| WO | WO 2006/053358 A1 | 5/2006 |
| WO | WO 2006/053359 A1 | 5/2006 |

\* cited by examiner

CHARGED PARTICLE SYSTEM

CROSS REFERENCE TO RELATED APPLICATIONS

This application is a National Stage application of International Application No. PCT/EP2006/010158, filed Oct. 20, 2006, which designates the United States, and which claims the benefit of European Application No. 05022915.2, filed Oct. 20, 2005. These applications, in their entirety, are incorporated herein by reference.

BACKGROUND OF THE INVENTION

1. Field of the Invention

The invention relates to a charged particle system, such as a lithography system.

2. Brief Description of Related Art

Lithographic processes are commonly used in the manufacture of semiconductor elements, such as integrated circuits (ICs), LSIs, liquid crystal elements, micro-patterned members and micromechanical components.

A charged particle lithography system generally comprises a beam generating system with a charged particle source, a patterning device and a particle-optical projection system. One or more charged particle beams generated by the beam generating system are generally directed to be incident on the patterning device adapted to endow the incident beam with a pattern or, in other words, generate a pattern of charged particle beamlets. The pattern is conveyed by charged particle beamlets transmitted through the patterning device which are subsequently focused and imaged, usually at a reduced scale, by the particle-optical projection system onto a substrate comprising a layer that is sensitive to charged particles such that the pattern defined by the patterning device is written onto the substrate.

The trend towards ever more sophisticated semiconductor devices requires semiconductor elements of smaller size and higher complexity which, in turn, places higher demands on performance and throughput achievable with lithography systems.

In lithographic processes, the substrate usually comprises a large number of dies, i.e. individual sections of the substrate onto which a predetermined device structure is to be written by exposure to patterned charged particle beams. Since a cross-section of the predetermined device structure is generally larger than a cross-section of the patterned beam, writing each device structure requires multiple exposure steps, which are generally performed by scanning the substrate relative to the projection system such that lines of each device structure are sequentially written onto the respective die. This type of exposure requires exact alignment of adjacent lines in order to avoid discontinuities or other faults in the written device structures.

Similar problems arise in charged particle inspection systems, wherein the projection system provides for illumination of a substrate to be inspected and/or is configured to provide a good image of the inspected region of the substrate surface onto a detector.

Therefore, it is an object of the present invention to provide an improved charged particle system.

SUMMARY OF THE INVENTION

As will be described in more detail in the following, the present invention provides in a first aspect a charged particle system, comprising: at least one particle source for generating one or more beams of charged particles; and a particle-optical projection system, comprising:
a focusing first magnetic lens having a main axis and comprising an outer pole piece having a radial inner end, and an inner pole piece having a lowermost end disposed closest to the radial inner end of the outer pole piece, wherein a gap is formed between the radial inner end of the outer pole piece and the lowermost end of the inner pole piece;
a focusing first electrostatic lens having at least a first electrode and a second electrode spaced apart in a direction of the main axis;
a controller having a first control portion configured to control a focusing power of the first electrostatic lens based on a signal indicative of a distance of a surface of the substrate from a portion of the first magnetic lens disposed closest to a substrate;
wherein a surface of the first electrode of the first electrostatic lens facing the second electrode has a distance from both the radial inner end of the outer pole piece and the lowermost end of the inner pole piece which is less than a distance of the lowermost end of the inner pole piece from the radial inner end of the outer pole piece.

In exemplary embodiments, the present invention provides a charged particle lithography system, comprising: at least one particle source for generating one or more beams of charged particles; a pattern defining structure; and a particle-optical projection system for imaging the pattern defined by the pattern defining structure onto a substrate. The particle-optical projection system comprises: a focusing first magnetic lens having a main axis and comprising an outer pole piece having a radial inner end, and an inner pole piece having a lowermost end disposed closest to the radial inner end of the outer pole piece, wherein a gap is formed between the radial inner end of the outer pole piece and the lowermost end of the inner pole piece; a focusing first electrostatic lens having at least a first electrode and a second electrode spaced apart from one another in a direction of the main axis; and a controller having a first control portion configured to control a focusing power of the first electrostatic lens based on a signal indicative of a distance of a surface of the substrate from a portion of the first magnetic lens disposed closest to the substrate; wherein a surface of the first electrode of the first electrostatic lens facing the second electrode has a distance from both the radial inner end of the outer pole piece and the lowermost end of the inner pole piece which is less than a distance of the lowermost end of the inner pole piece from the radial inner end of the outer pole piece.

In other exemplary embodiments, the charged particle system is an inspection system configured to inspect a surface of the substrate. The inspection system generally further comprises a detector for detecting secondary charged particles emitted or reflected by the substrate as a result of primary charged particles impinging thereon. The inspection system may further comprise a beam splitter. A general layout and functions of components of an inspection system will be explained further with reference to FIG. 4.

The inspection system may be an electron microscope of the SEEM-type and LEEM type, respectively, for instance, in which an extended region or field is illuminated on the substrate surface by a primary electron beam, and secondary electrons emanating from this field are imaged by means of an electron optics on a position-sensitive detector in an image-preserving manner in order to obtain an electron-optical image of the object on the detector. In other embodiments, the inspection system may be, for instance, an electron microscope of the SEM type, in which a finely focused probeforming primary electron beam is scanned across the substrate surface, and an integral secondary electron intensity is detected in dependence of a position of the finely focused primary electron beam on the object plane in order to obtain an electron-optical image of the object.

The secondary charged particles may be mirrored charged particles, backscattered charged particles, charged particles emitted by the substrate as a result of primary charged particles impinging thereon, or any other kind of charged particles. The charged particles may be electrons, ions, muons, or any other suitable charged particles.

Thus, in the first aspect of the present invention, a charged particle system, such as a lithography system, is provided which allows dynamic adjustment of the focusing power of the electrostatic lens and thus an overall focusing power of the particle-optical projection system in response to a signal indicative of the distance between the surface of the substrate to be exposed and/or inspected and the magnetic lens. For instance, the focusing power may be adjusted a plurality of times during a lithographic exposure and/or inspection of the substrate.

The distance between the surface of the substrate and the magnetic lens, or more generally speaking an exit end of particle-optical projection system of the lithography system, may also be referred to as a z-displacement. The z-displacement may also be generally described as the displacement in a z-direction of an object to be exposed by the lithography system and/or inspected by an inspection system, a surface of which object is arranged in a xy-plane orthogonal to the z-direction, with the z-direction coinciding with an optical axis of the charged particle system. On the other hand, a so-called z-position refers to a position in a z-direction, i.e. an axial position, of the image generated by the particle-optical projection system.

The substrate may be any substrate known in the art. In those embodiments wherein the charged particle system is a lithography system, substrates may, for instance, comprise silicon wafers coated with one or more layers of resist sensitive to exposure by charged particle irradiation, sapphire substrates, metal and glass substrates and others. Manufacturing the substrate itself, coating the surface of the substrate with resist and further handling as well as treatment processes may lead to unevenness and roughness of the substrate surface.

Due to the unevenness of the substrate surface, being able to adjust an overall focusing power to match the actual distance between the substrate surface to be exposed and/or inspected and the magnetic lens, and thus the charged particle system, provides the advantage of an improved exposure/inspection performance. Thereby, a plane of the image generated by the particle-optical projection system can be adjusted to coincide with the region of the surface of the substrate being exposed and/or inspected, i.e. such that z-position and z-displacement coincide. In other words, the charged particle system according to the first aspect of the present invention allows to dynamically responding to a change in the z-displacement by adjusting the z-position.

The focusing first magnetic lens may be any magnetic lens known in the art, most preferably an electromagnetic lens. In exemplary embodiments, the magnetic lens is rotationally symmetric with respect to its main axis and preferably also, the gap formed between respective ends of the inner and outer pole pieces is a substantially axial gap. The main axis of the magnetic lens may be arranged to coincide with the optical axis of the charged particle system. Preferably, in a particle-optical projection system comprising a plurality of magnetic lenses, the first magnetic lens is the magnetic lens disposed closest to the substrate, and even more preferably the first magnetic lens is the focusing lens of the projection system which is disposed closest to the substrate.

Providing a first electrostatic lens such that at least the first electrode thereof is disposed in a region of the gap formed between the lowermost end of the inner pole piece and the radial inner end of the outer pole piece allows to advantageously generate an electrostatic field which largely overlaps with a magnetic field generated by the first magnetic lens in the region of the gap.

Thereby, in an exemplary embodiment of the present invention according to the first aspect, a kinetic energy of charged particles being transmitted through the electrostatic and magnetic fields can be adjusted and accordingly the focusing power of the magnetic lens, in addition to the focusing power of the first electrostatic lens, adjusted without exerting a detrimental influence on a magnetic state of the magnetic lens. By way of example, a change of kinetic energies of the charged particles passing through the first magnetic and first electrostatic lenses in the order of several $1/1000$ (per mils) allows to alter the z-position of the image generated by several $1/1000$ (per mils) of the focal length of the objective lens/projection system.

In exemplary embodiments, a surface of the second electrode of the first electrostatic lens facing the first electrode has a distance from the lowermost end of the inner pole piece which is less than the distance of the lowermost end of the inner pole piece from the radial inner end of the outer pole piece. In those embodiments, both the first and the second electrodes may be disposed in an axial region extending between a plane extending through the lowermost end of the inner pole piece and a plane extending through the radial inner end of the outer pole piece, both planes being orthogonal to the main axis and thus the z-direction. The first and second electrodes are in those embodiments disposed inside a bore extending through the magnetic lens and being confined by the radial inner ends of the inner and outer pole pieces.

In further exemplary embodiments, all electrodes of the first electrostatic lens are disposed at a distance from the substrate which is greater than a distance between the radial inner end of the outer pole piece and the substrate, as measured in the direction of the main axis. Thus, in those embodiments, all electrodes of the first electrostatic lens may be disposed inside the bore extending through the first magnetic lens.

These embodiments are advantageous in providing a suitable overlap of the electrostatic field generated by the first electrostatic lens and the magnetic field generated by the first magnetic lens.

The first electrostatic lens may comprise a third electrode spaced apart from the first and second electrodes. In exemplary embodiments, the first electrostatic lens comprises a third electrode and is configured as an Einzel lens.

An Einzel lens generally comprises a first, a second and a third electrode, which are spaced apart from one another along the main axis. Typically, the Einzel lens is operated such that the first and third electrodes are grounded and the second electrode held at a predetermined voltage thus generating two electrostatic fields, one of which is decelerating whereas the other one is accelerating. This allows the electrons to be focused without imparting any net acceleration and hence net change of kinetic energy. Therefore, use of an Einzel lens such that the electrostatic field generated within the Einzel lens overlaps with the magnetic field of the first magnetic lens is advantageous in that electrons passing through the Einzel lens experience a temporary change in kinetic energy such that a focusing effect of the magnetic lens exerted upon them is changed. But due to the symmetry of the Einzel lens, the change in kinetic energy is evened out before the electrons exit from the Einzel lens. This allows to effect a net change of the z-position without changing a net kinetic energy of the electrons and thus imaging characteristics of the entire lithography system. Changing a focusing power of the Einzel lens generally involves changing a voltage applied to the second electrode of the Einzel lens, and thus a potential difference between the second and the first and between the second and the third electrodes, such that a field strength of the accelerating and decelerating electrostatic fields is altered.

In other exemplary embodiments, the first electrostatic lens has exactly two electrodes, the first and the second electrode, and is configured as an immersion lens. Other electrostatic lenses known in the art may also be used.

In those exemplary embodiments wherein an immersion lens is used, the kinetic energy of the charged particles passing through the magnetic field generated by the first electromagnetic lens is changed by the first electrostatic lens, and a change of the z-position is achieved by a focusing effect of the first electrostatic lens overlapping with a focusing effect of the first magnetic lens such that a desired z-position is achieved.

The signal indicative of the distance of the surface of the substrate from the first magnetic lens may be obtained in numerous ways.

For instance, the surface of the substrate to be exposed and/or inspected may be measured and evaluated before exposure and/or inspection thereof by known methods. Thus, a map of the surface may be obtained. The data representing the map of the substrate surface are provided to the first control portion of the controller, which is suitably programmed, for instance, to relate a position or region on the map (representing the signal indicative of said distance, in that case) with a position or region of the substrate that is currently being exposed/inspected, i.e. a position or region upon which charged particle beamlets are incident at the time, and to associate the position with corresponding z-displacement, and, if required, to issue a control signal indicating an extent of an adaptation of a potential supplied to the first electrostatic lens, for instance. Thus, each position or region of the substrate surface may have a setting of operating parameters of the first electrostatic lens associated therewith such that a change in z-displacement may be dynamically corrected for by a change in z-position as effected by a change of one or more operating parameters of the first electrostatic lens.

In exemplary embodiments, the focusing power of the first electrostatic lens is changed by effecting a change of a field strength of the electrostatic field generated by the first electrostatic lens, for instance by changing a potential difference between the electrodes of the electrostatic lens. Electrostatic lenses are particularly suited for dynamic fine adjustment of the focusing power provided by the first magnetic lens since their focusing effect can be changed at high speed due to the electrostatic field generated by the electrostatic lens responding practically without delay to a change in a potential or potential difference, respectively, applied thereto.

In exemplary embodiments of the first aspect of the present invention, the charged particle system further comprises a distance measuring system configured to generate the signal indicative of the distance of the surface of the substrate from the first magnetic lens, based on a distance measurement of the distance of the surface of the substrate from a portion of the first magnetic lens or any other distance suitable to be indicative of the distance between the substrate surface and the first magnetic lens. A suitable distance measuring system may comprise an interferometer system, for instance.

Interferometric systems and methods for determining the z-displacement of an object are known in the art. An example of such a system may be found in US application US 2005/0179909 A1 to Krijnen, the entire contents of which are incorporated by reference herein.

The controller may be any suitable controller known in the art. In general, a charged particle system, such as a lithography system, typically comprises a main controller for controlling a set of parameters for a plurality of components of the charged particle system. In the present invention, the main controller would, in an exemplary embodiment, control an excitation current supplied to the first and any additional electromagnetic lenses of the projection-optical system, and may control additional components such as the pattern defining structure in case of a lithography system, etc. The controller may, for instance, form a part of the main controller or be provided separately.

In further exemplary embodiments, the present invention provides a charged particle system as defined above wherein the particle-optical projection system is configured to generate at least one intermediate image, wherein the particle-optical projection system further comprises a second electrostatic lens having at least a first electrode and a second electrode which are spaced apart from one another in a direction of the main axis; wherein the controller further has a second control portion configured to control a focusing power of the second electrostatic lens based on a signal indicative of an imaging magnification of the particle-optical projection system; and wherein all electrodes of the second electrostatic lens are disposed between the intermediate image and the lowermost end of the inner pole piece of the first magnetic lens and at a distance from the lowermost end of the inner pole piece of the first magnetic lens greater than 20 mm.

In case of a lithography system, the intermediate image is an intermediate image of the pattern, wherein the particle-optical projection system is configured to image the intermediate image onto the substrate.

In case of an inspection system, the intermediate image may be an intermediate image of the pattern, as in the case of the lithography system, or may be an intermediate image formed by secondary charged particles. The pattern, in this case, may also be a homogeneously illuminated aperture (or the image thereof, respectively). Thus, the intermediate image may refer to an intermediate image formed in (by) the first or secondary charged particles or particle beam paths, respectively.

More generally, in exemplary inspection systems, the particle-optical projection system may further comprise a second electrostatic lens having at least a first electrode and a second electrode spaced apart in a direction of the main axis; wherein the controller further has a second control portion configured to control a focusing power of the second electrostatic lens based on a signal indicative of an imaging magnification of the particle-optical projection system; and wherein all electrodes of the second electrostatic lens are disposed upstream of the lowermost end of the inner pole piece of the first magnetic lens and at a distance from the lowermost end of the inner pole piece of the first magnetic lens greater than 20 mm.

In those exemplary embodiments of inspection systems comprising a beam splitter, all electrodes of the second electrostatic lens may be disposed between the beam splitter and the lowermost end of the inner pole piece of the first magnetic lens.

In exemplary embodiments, the first magnetic lens may be disposed downstream of the intermediate image, that is closer to the substrate than the intermediate image. Preferably, in those embodiments where a plurality of magnetic lenses is provided, the first magnetic lens is the magnetic lens disposed closest to the substrate.

The term imaging magnification comprises both imaging magnification and demagnification and indicates a size of the pattern imaged onto the substrate in relation to the size of the pattern being imaged. In inspection systems, the imaging magnification may also refer to a size of a region on the substrate an image of which is transferred onto the detector by secondary charged particles relative to a region in which the secondary charged particles transferring this image land on the detector.

In further exemplary embodiments, all electrodes of the second electrostatic lens are disposed upstream of the lowermost end of the inner pole piece of the first magnetic lens, for instance between the intermediate image and the lowermost end of the inner pole piece of the first magnetic lens, and at a distance from the lowermost end of the inner pole piece of the first magnetic lens greater than 25.3 mm, or greater than 45.8 mm, and may be disposed at a distance of at most 77.8, or 61.8 mm. The same distances may also be applied in those embodiments wherein the second electrostatic lens is disposed between the beam splitter and the lowermost end of the inner pole piece.

Providing an electrostatic lens in the above indicated position is also advantageous independently of the provision of the first electrostatic lens such that the invention relates, in a second aspect, to a charged particle system, comprising: at least one particle source for generating one or more beams of charged particles; and a particle-optical projection system comprising: a first magnetic lens having a main axis and comprising an outer pole piece having a radial inner end, and an inner pole piece having a lowermost end disposed closest to the radial inner end of the outer pole piece, wherein a gap is formed between the radial inner end of the outer pole piece and the lowermost end of the inner pole piece; a second electrostatic lens having at least a first electrode and a second electrode spaced apart in a direction of the main axis; and a controller having a second control portion configured to control a focusing power of the second electrostatic lens based on a signal indicative of an imaging magnification of the particle-optical projection system; wherein all electrodes of the second electrostatic lens are disposed upstream of the lowermost end of the inner pole piece of the first magnetic lens and at a distance from the lowermost end of the inner pole piece of the first magnetic lens greater than 20 mm.

Thus, an exemplary charged particle lithography system comprises: at least one particle source for generating one or more beams of charged particles; a pattern defining structure; a particle-optical projection system imaging the pattern defined by the pattern defining structure onto a substrate, wherein the projection system is configured to generate at least one intermediate image of the pattern and to image the intermediate image on the substrate, with the particle-optical projection system comprising: a first magnetic lens having a main axis and comprising an outer pole piece having a radial inner end, and an inner pole piece having a lowermost end disposed closest to the radial inner end of the outer pole piece, wherein a gap is formed between the radial inner end of the outer pole piece and the lowermost end of the inner pole piece; a second electrostatic lens having at least a first electrode and a second electrode spaced apart in a direction of the main axis; and a controller having a second control portion configured to control a focusing power of the second electrostatic lens based on a signal indicative of an imaging magnification of the particle-optical projection system; wherein all electrodes of the second electrostatic lens are disposed between the intermediate image and the lowermost end of the inner pole piece of the first magnetic lens and at a distance from the lowermost end of the inner pole piece of the first magnetic lens greater than 20 mm.

The signal indicative of the imaging magnification may be any suitable signal known in the art. As an example, the signal may be based on a calibration value of the imaging magnification. For instance, once the charged particle system or at least the particle-optical projection system is assembled, the system may be calibrated to determine an effect of one or more components of the particle-optical projection system on imaging characteristics such as imaging magnification and image rotation. In other words, for a number of settings of each of the components in combination with a number of settings of the other components, a value of an imaging characteristic is obtained. The setting may comprise an excitation current in case of an electromagnetic lens, a potential difference for an electrostatic lens, and so forth, as will be readily apparent to the person skilled in the art. Thus, a set of calibration values for various imaging characteristics is obtained. Thus, the signal indicative of the imaging magnification may be a signal indicating a calibration value of the imaging magnification obtained for a setting of the components that corresponds to the actual setting in the lithographic/inspection process at the time the signal is received. Obtaining calibration values for the imaging magnification and rotation may be accomplished in a number of ways. In a lithography system, for instance, for each calibration value for the combination of settings of the various components being calibrated a resist-coated wafer comprising alignment marks is exposed and an orientation and size of the thus produced image on the wafer determined. Thus, changing a setting of a component incrementally whilst keeping the settings of the other components constant allows to determining a relationship between the setting of that particular component and the assessed imaging characteristics. This may be repeated for each of the components to obtain a set of calibration values for each possible combination of settings of the components. The components calibrated in that way may not comprise any components provided for the sole purpose of correcting one or more imaging characteristics, such as the first and second electrostatic lenses, or they may involve the correction elements and different settings thereof. It is also conceivable to have a first set of calibration values for operation of the particle-optical system without any correcting components and a second set of calibration values wherein for each setting of each component, different settings of any correcting components are calibrated. Analogous considerations apply for inspection systems.

In a manner similar to that of the first control portion, the second control portion may be adapted to compare a signal indicative of a value of an actual imaging magnification to a desired value of the imaging magnification, and if a difference between these two values exceeds a predetermined threshold value, to issue a control command to the second electrostatic lens, for instance changing a potential difference applied thereto, in order to adjust the imaging magnification to the desired value of imaging magnification.

In analogy to the above mentioned embodiment of the particle-optical system according to the first aspect of the present invention, in exemplary embodiments, all electrodes of the second electrostatic lens may be disposed may be disposed upstream of the lowermost end of the inner pole piece of the first magnetic lens and at a distance from the lowermost end of the inner pole piece of the first magnetic lens greater than 25.3 mm, or greater than 45.8 mm, and may be disposed at a distance of at most 77.8, or 61.8 mm. All electrodes of the second electrostatic lens being disposed upstream may encompass all electrodes of the second electrostatic lens being disposed between the intermediate image and the lowermost end of the inner pole piece of the first magnetic lens. In exemplary embodiments of inspection systems, upstream may encompass, for instance, between the beam splitter and the lowermost end of the inner pole piece of the first magnetic lens; as described above, the intermediate image in inspection system may refer to the intermediate image of the charged particle source, i.e. the primary beam path, or to the intermediate image of a region of the substrate being inspected, i.e. the secondary beam path.

Preferably, the particle-optical projection system in a lithography system is configured to provide only one intermediate image. Likewise, the particle-optical projection system in an inspection system is preferably configured to provide only one intermediate image each in the primary and secondary beam paths, respectively. In an alternative embodiment, in an inspection system, formation of an intermediate image could be avoided altogether.

The second electrostatic lens may comprise only two electrodes and be configured as an immersion-type lens, or may comprise three electrodes and be configured as an Einzel lens or may have any other suitable configuration known in the art for focusing charged particles.

As used herein, upstream and downstream as well as upper and lower refer to a general direction in which the one or more beams of (primary) charged particles travel through the lithography system from the charged particle source to the substrate, with lower and downstream indicating a position closer to the substrate and upper and upstream indicating a position closer to the charged particle source.

Thus, the second electrostatic lens is advantageously disposed upstream of the magnetic field generated by the first magnetic lens such that an electrostatic field generated by the second electrostatic lens should show very little, if any, overlap therewith. Such a position of the second electrostatic lens allows the second electrostatic lens to exert a large influence on a magnification or demagnification, respectively, of the image being imaged onto the substrate whilst minimizing an influence exerted by the second electrostatic lens on other imaging parameters, such as the z-position and the rotation of the image, as far as possible.

The second electrostatic lens may, for instance, be disposed substantially in an upper portion of the bore formed inside the first magnetic lens.

In embodiments comprising the second electrostatic lens, the particle-optical projection system may only contain one magnetic lens. In other exemplary embodiments, the particle-optical projection system may further comprise a second magnetic lens upstream of the first magnetic lens. In those embodiments, it is preferred that the second electrostatic lens be disposed in a region that is also disposed at a sufficient distance from a magnetic field generated by the second magnetic lens such that it is disposed in a region that is substantially free from any magnetic fields.

Combining the teachings of the first and second aspect of the present invention, that is providing both a first and a second electrostatic lens at above indicated positions relative to a gap of the first magnetic lens is advantageous not only in that both the z-position and the imaging magnification may be simultaneously adjusted, but also in that an undesired influence on the z-position which may be exerted by the second electrostatic lens may be compensated for by the first electrostatic lens, for instance.

As outlined above, the first electrostatic lens is positioned and configured such that it mainly controls the z-position, but generally also has an effect on the image rotation and imaging magnification, whilst the second electrostatic lens is positioned and configured such that it mainly controls the imaging magnification and generally has a relatively smaller effect, if any, on the image rotation and z-position. In exemplary embodiments, these effects may be taken into account in order to obtain an optimum imaging performance. That is, in those exemplary embodiments, controlling the focusing powers of the first and second electrostatic lenses may involve taking into account an effect exerted by one electrostatic lens on the imaging characteristic to be adjusted by the respective other electrostatic lens.

In those exemplary embodiments, the signal indicative of the imaging magnification that forms the basis for controlling the focusing power of the second electrostatic lens by the second control portion may be, for instance, based on a calibration value taken with an actual setting of the first electrostatic lens, for instance in particular a potential difference applied thereto. In alternative exemplary embodiments, the signal may comprise a first signal portion representing, for instance, the imaging magnification without taking into account any effect the first electrostatic lens may have thereon, and the signal may further comprise a second signal portion indicative of an effect on the imaging magnification resulting from an actual setting of the first electrostatic lens. In said latter embodiment, the second control portion would preferably be configured to relate the two signal portions to one another such as to determine a suitable setting for the second electrostatic lens in order to achieve a desired overall imaging magnification and issue a corresponding control signal to the second electrostatic lens, or a voltage supply configured to apply a potential difference thereto, more precisely. Analogous considerations apply to the first control portion. Alternatively, the second signal portion could indicate the actual setting of the first electrostatic lens and the second control portion be configured to relate the second signal portion to an effect of the setting of the first electrostatic on the imaging magnification, and subsequently derive an optimum setting for the second electrostatic lens. Given that an optimum setting of the first electrostatic lens would generally influence an optimum setting of the second electrostatic lens and vice versa, the controller preferably comprises a feedback control portion that determines optimum settings for the first and second electrostatic lenses based on one or both of the signals indicative of the imaging magnification and the signal indicative of the z-position as well as the optimum setting determined for each of the first and second electrostatic lenses. The first and second control portions may, for instance, each comprise a respective feedback sub-portion configured to communicate with one another, thus forming the feedback control portion of the controller. Other configurations are also conceivable.

An example of a particle-optical projection system comprising three electromagnetic correction elements wherein each of the correction elements determines its driving current from target corrections together with the changes produced by each of the corrections lenses is disclosed in U.S. Pat. No. 6,008,498, the entire contents of which are incorporated by reference herein. Analogous considerations may be applied to the determination of optimum settings of the first and second electrostatic lenses in the present application.

In further exemplary embodiments of the charged particle system according to the first and second aspect of the present invention, the particle-optical projection system further comprises a solenoid coil, said solenoid coil being disposed about the main axis of the particle-optical projection system and upstream of the first magnetic lens. In an exemplary lithography system, the solenoid coil may be disposed between the pattern defining structure and the first magnetic lens. In exemplary inspection systems, the solenoid coil may be disposed between the beam splitter and the first magnetic lens. In further exemplary embodiments, the particle-optical projection system further comprises a second magnetic lens interposed between the pattern defining structure or beam splitter and the first magnetic lens, wherein said solenoid coil is interposed between the first and second magnetic lenses. In preferred embodiments of the charged particle system comprising said solenoid coil, the controller comprises a third control portion configured to control an excitation current supplied to the solenoid coil based on a signal indicative of a rotation of the one or more beams of charged particles.

Magnetic fields generated by magnetic lenses change an orientation of charged particles passing through them such that an image of a pattern imaged onto the substrate by the charged particles is rotated. Advantageously, the rotation and thus orientation of the image is controlled such that each point of a pattern imaged onto the substrate is oriented properly relative to other points of the pattern imaged onto the substrate. While there are design rules for lithography systems, or charged particle systems in general, that allow to even out an occurring image rotation, for instance by arranging two magnetic lenses in series such that the image rotation introduced by one of them compensates the image rotation introduced by the other one, it may also be desirable to allow for a dynamic control of image rotation in response to an alteration of imaging conditions, a current of charged particles downstream of the pattern defining means and other parameters.

The solenoid coil comprises a number of windings of a metal wire and is arranged and configured to generate a magnetic field in a region of the optical axis of the charged particle system when an excitation current is passed through the windings. A magnetic field strength of the magnetic field generated by the solenoid coil is dependent on a configuration of the coil, in particular parameters such as a number of windings, a configuration of the bore formed between them and a shape of the coil, as well as an excitation current passing through the solenoid coil.

Since the solenoid coil used in these exemplary embodiments of the present invention does not generate a magnetic field by means of pole pieces surrounding the solenoid coil, but merely by the current through the windings of the coil, a magnetic field can be quickly adjusted by changing the excitation current supplied to the solenoid coil.

Preferably, in those embodiments of the present invention comprising the solenoid coil, the solenoid coil is disposed in a position in the projection system where it interferes as little as possible with pole pieces of magnetic lenses disposed in the vicinity of the solenoid coil, i.e. the solenoid coil is preferably disposed at a suitable distance from any adjacent magnetic pole pieces.

The terms rotation of the one or more beams of charged particles may be referred to hereinafter simply as rotation and is used synonymously with image rotation in the context of the present invention.

In those exemplary embodiments of the present invention that comprise both first and second electrostatic lenses as well as the solenoid coil, three correction elements for fast and selective adjustment of image rotation, z-position and imaging magnification are provided. Those exemplary embodiments have a further benefit in that any undesired effects that one of the correction elements has on a given imaging parameter may be compensated for by one or both of the other correction elements.

To this effect, the signal indicative of the rotation of the one or more beams of charged particles may be comprised of a first signal portion indicative of a rotation of the one or more beams of charged particles caused by at least one of the first and second electrostatic lenses and a second signal portion indicative of a rotation of the one or more beams of charged particles caused by the particle-optical projection system with the exception of the first and second electrostatic lenses and the solenoid coil. In other exemplary embodiments, the signal of the rotation of the one or more beams of charged particles may be formed only by the first signal portion indicative of a rotation of the one or more beams of charged particles caused by at least one of the first and second electrostatic lenses, such that the solenoid coil may be used to compensate only for any rotation introduced by the first and second electrostatic lenses.

In other words, the signal indicative of the rotation may comprise the second signal portion, which generally indicates the rotation of the particle-optical projection system after assembly without taking into account any contributions from any correction elements, in particular the first and second electrostatic lenses and the solenoid coil. The first signal portion is indicative of any rotation introduced into the particle-optical projection system by the first and second electrostatic lenses. Since a setting and thus focusing power of the first and second electrostatic lenses may be adjusted during a lithographic exposure/inspection, the signal indicative of the rotation introduced thereby would advantageously represent the actual situation that the control of the excitation current of the solenoid coil would need to be adjusted to. The first signal portion may be derived from relating a current setting of the first and second electrostatic lens to a calibration value for a rotation resulting from said current setting, for instance. In this way, it is possible to optimize a setting for all three correction elements.

It is to be noted that the term signal portion, as used herein, is meant to denote one part of a signal that is composed of several parts, wherein those parts may be separate independent signals that are combined or added or related in any other suitable way to form the signal.

An exemplary method of measuring a position and size of the image generated by a lithography system on the substrate is disclosed in U.S. Pat. No. 6,661,015 to A. Chalupka, G. Stengl, H. Loeschner and R. Nowak and in Austrian Patent Application A 1927/2004 to G. Stengl, R. Nowak and H. Buschbeck, entitled "Pattern Lock System for Maskless Particle-Beam Exposure Apparatus", filed Nov. 17, 2004, the entire contents of which are incorporated by reference herein.

The charged particle system of the present invention comprises, in exemplary embodiments of the present invention, a main controller for at least controlling a focusing power of the first magnetic lens, which main controller is further configured to supply the second signal portion. In those embodiments wherein the particle-optical projection system comprises further magnetic lenses, the main controller preferably controls those further magnetic lenses as well. In general, the main controller preferably controls at least all those components of at least the particle-optical projection system that do not require dynamic adjustment, i.e. controls at least a basic setting of the particle-optical projection system. The controller having the first, second, third and/or fourth control portion may be part of the main controller or may be provided separately.

The first through fourth control portions are generally configured to allow dynamic control. i.e. enable a fast response to a change of z-position, imaging magnification and/or image rotation during a lithographic exposure of a substrate.

In exemplary embodiments, the first control portion is configured to adjust the focusing power of the first electrostatic lens and thus the z-position based on a signal generated by the distance measuring system, and the second control portion is configured to control the focusing power of the second electrostatic lens based on a signal containing a first signal portion indicative of an imaging magnification effected by at least one of the first and second electrostatic lenses and a second signal portion indicative of an imaging magnification of the particle-optical projection system with the exception of the first and second electrostatic lenses and the solenoid coil; and the third control portion is configured to control the excitation current applied to the solenoid coil based on a signal indicative of a rotation of the one or more beams of charged particles, said signal containing a first signal portion indicative of a rotation of the one or more beams of charged particles caused by at least one of the first and second electrostatic lenses and a second signal portion indicative of a rotation of the one or more beams of charged particles caused by the particle-optical projection system with the exception of the first and second electrostatic lenses and the solenoid coil, and wherein the respective second signal portions are provided by the main controller.

In further exemplary embodiments, the controller comprises a fourth control portion configured to control at least one of a focusing power of the first electrostatic lens, a focusing power of the second electrostatic lens and an excitation current supplied of the solenoid coil based on a signal indicative of a current of charged particles incident on the substrate. In further exemplary embodiments, the signal is generated by a measurement of a potential difference between the particle source and a mount holding the substrate, which collects charge in dependence of the total quantity of charged particles incident thereon.

In terms of obtaining optimum settings for all correcting elements, calibration, providing feedback between the individual correcting elements and so on, the embodiments and possibilities described above apply in an analogous manner.

The charged particle source may be any conventional particle source suitable for use in the present invention. In those embodiments where the charged particles are electrons, an electron source, such as an electron source of a thermal field emission (TFE) type, may be used. In those embodiments employing ions as charged particles, an ion gun would be a suitable charged particle source, for instance. Further examples of charged particle sources suitable for use in the present invention include sources having a tungsten (W) filament, $LaB_6$ sources and various others. The charged particle source may be, for instance, a source of a single beam of charged particles, may be an array of sources of a single charged particle beam each, or may be a multi-beam source.

The pattern defining structure used in the lithography embodiments of the present invention may be any pattern defining structure known in the art. For instance, the pattern defining structure may be a mask comprising a pattern of areas that are opaque to charged particles and areas that are transparent to charged particles such that charged particles may only pass through transparent areas of the mask transparent thus defining the pattern. Preferably, the pattern defining structure is a so-called blanking aperture array. A blanking aperture array typically comprises a substrate comprising an aperture array wherein a set of electrodes is provided for each aperture of the aperture array, with an electrode being disposed on either side of the aperture so as to provide a deflecting or blanking arrangement for charged particles passing through the apertures. Generally, a beam of charged particles generated by the charged particle source is formed into a broad and telecentric beam by one or more particle optical components, such as a condenser. The broad beam is then directed at the blanking aperture array. Charged particles passing through the apertures form charged particle beamlets. The deflecting arrangement provided on each aperture may be activated by applying a potential difference between the electrodes on either side of the aperture, i.e. switched on, such that a beamlet of charged particles generated by the respective aperture is deflected from a straight beam path and incident on an aperture stop such that it does not reach the substrate. If the deflecting arrangement of an aperture is switched off, the charged particles form a beamlet that follows a predetermined path and is subsequently directed at the substrate. Thus, it is possible to generate a pattern on the substrate which is defined by the undeflected charged particle beamlets. Such as system is disclosed, for instance, in US 2003/0155534 A1, the entire contents of which is incorporated by reference herein.

In addition to the first magnetic lens, the particle-optical projection system comprised in the projection system of the present invention may further comprise one or more additional magnetic lenses, one or more additional electrostatic lenses and additional imaging property correcting components.

Distances between components which are referred to herein, shall generally indicate a distance between surfaces of the components, that is a distance between a first component and a second component indicates a distance between a surface of the first component, which surface faces the second component and a surface of the second component, which surface faces the first component, unless otherwise indicated.

The embodiments described herein in relation to lithography systems are also applicable to exemplary inspection systems, in which, obviously, no pattern defining structures are employed.

Suitable detectors and beam splitters, as well as further components of inspection systems are well know from the prior art.

BRIEF DESCRIPTION OF THE DRAWINGS

The foregoing as well as other advantageous features of the present invention should become more apparent from the following detailed description of an exemplary embodiment of the invention with reference to the accompanying drawings. It is noted that not all possible embodiments of the present invention necessarily exhibit each and every, or any, of the advantages identified herein.

DETAILED DESCRIPTION OF DEPICTED EMBODIMENTS

Figure 1:
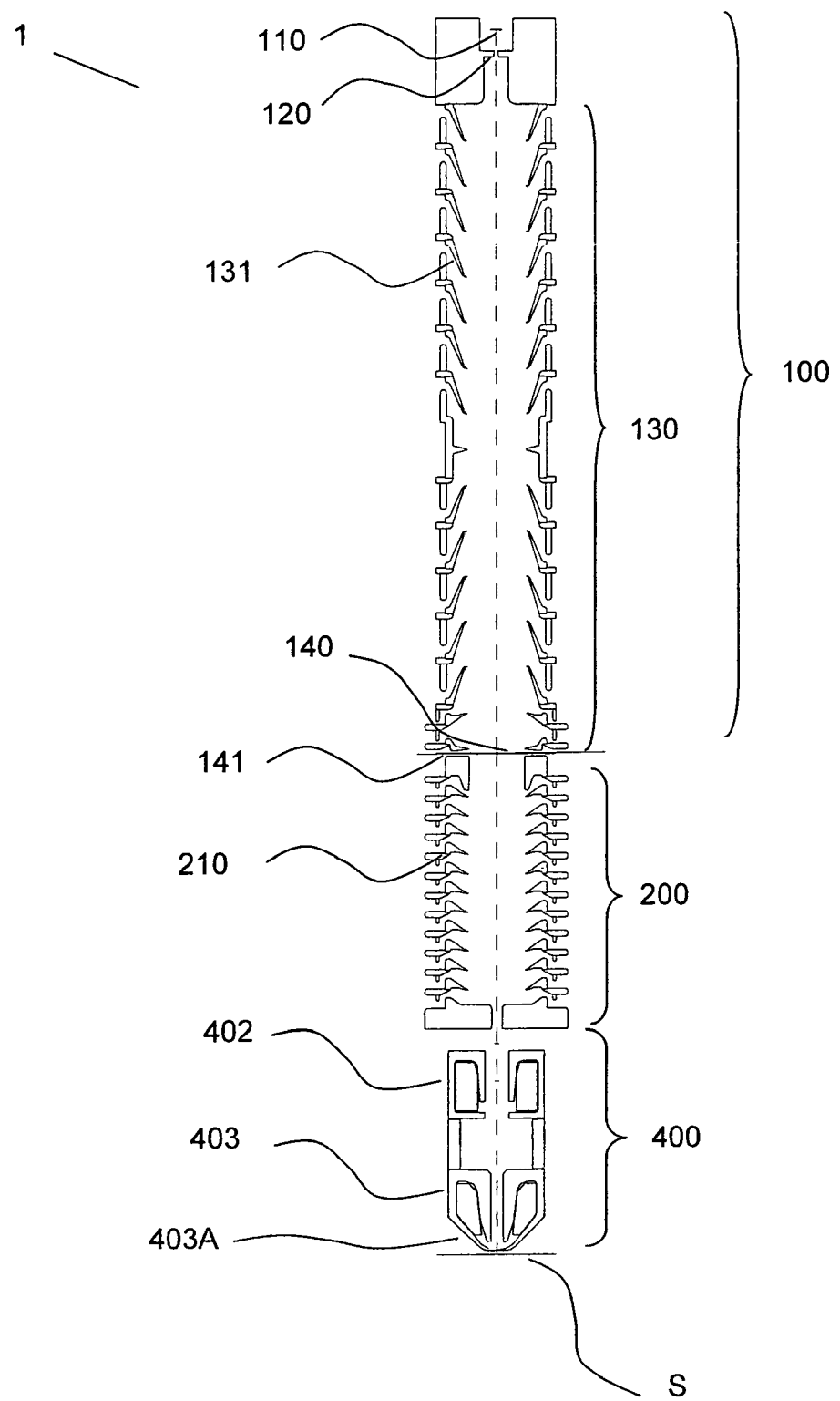
FIG. 1 schematically illustrates an embodiment of a charged particle lithography system according to the present invention, in a cut-open view.

In FIG. 1, an embodiment of a charged particle lithography system according to the present invention is illustrated in a schematic and simplified manner. Lithography system 1 comprises, in a direction in which the charged particles would generally travel, a beamlet generating arrangement 100, and a particle-optical projection system comprising an electrostatic lens 200 and electromagnetic focusing lens arrangement 400. The beamlet generating arrangement 100 comprises a charged particle source 110, an extraction system 120 and a condenser lens 130. The condenser lens 130 comprises a stack of electrodes 131. The beamlet generating system 100 further comprises a pattern defining structure 140 held by a mounting frame 141. The pattern defining structure 140 generally comprises a multi-aperture plate, and may be a blanking aperture array as described above. The electrostatic lens arrangement 200 comprises a plurality of electrode elements 210 which are arranged in series along the optical axis of the system. The particle-optical projection system further comprises an electromagnetic focusing lens arrangement 400 comprising two electromagnetic lenses 402 and 403, with a focusing first magnetic lens 403 being disposed closest to a substrate S, and thus substrate plane, and comprising a conical portion 403A and a focusing second magnetic lens 402 being disposed upstream of the first magnetic lens 403.

The first electrostatic lens, the second electrostatic lens the solenoid coil, the controller and the main controller are not shown in FIG. 1 for sake of simplicity.

The charged particle source 110 generates charged particles, and may be, for instance, an electron gun generating electrons. Extraction system 120 extracts the generated charged particles, accelerates them to a desired energy level and directs them towards substrate S. Condenser lens 130 directs and forms the charged particles into a substantially telecentric beam of charged particles. The beam of charged particles is then incident on pattern defining structure 140. In case of a blanking aperture array, charged particles pass through the apertures of the blanking aperture arrays and those passing through apertures that are in a switched on state form a plurality of beamlets for imaging the pattern defined by the switched on apertures and are subsequently focused and directed at the substrate.

The electrostatic lens arrangement 200 depicted in FIG. 1 forms an immersion-type lens. For providing a focusing effect, an electrostatic field is generated by applying a suitable electric potential to electrode elements of the electrostatic lens arrangement 200. Together with the electromagnetic focusing lens arrangement 400, the electrostatic lens arrangement 200 serves to project a demagnified image of the pattern defined by pattern defining structure 140, in the case of a blanking aperture array more precisely a reduced-scale image of a focal plane of beamlets having passed the switched on apertures, into the substrate plane to expose a substrate disposed therein with the a reduced-scale pattern as defined by the switched on apertures.

Figure 2:
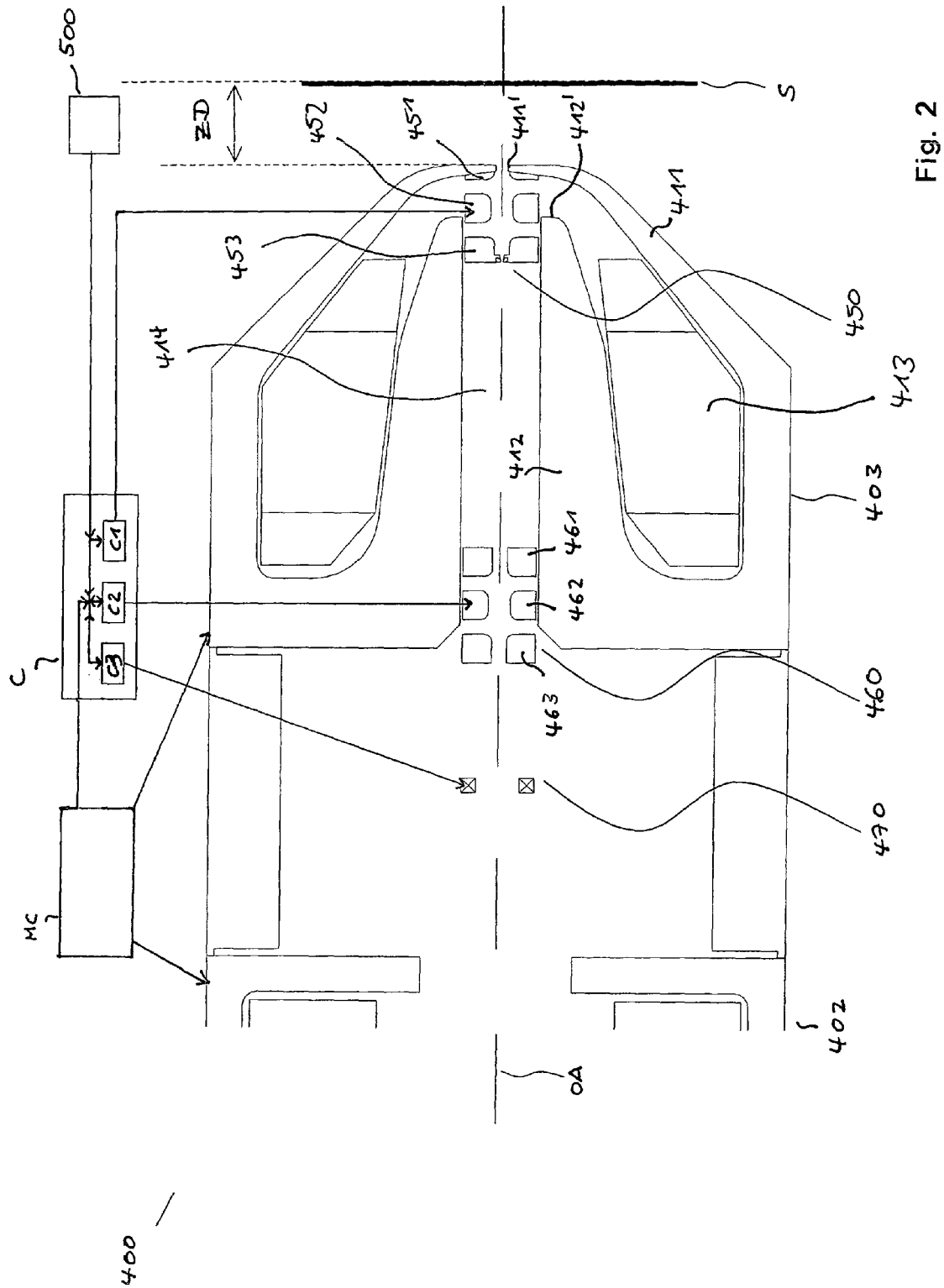
FIG. 2 schematically shows a detail of a projection system comprised in the lithography system illustrated in FIG. 1.

In FIG. 2, a detail of the electromagnetic focusing lens arrangement 400 as part of the particle-optical projection system is illustrated, with like reference numerals referring to like structures. The first magnetic lens 403 comprises an inner pole piece 412 having a lowermost end 412', an outer pole piece 411 having a radial inner end 411' and a coil 413 interposed between radial outer sections of the inner and outer pole pieces 411, 412 for inducing magnetic flux in the pole pieces 411, 412 for generating a magnetic field in a region of the optical axis OA. The first magnetic lens 403 is arranged such that a main axis thereof coincides with the optical axis OA of the lithography system 1. The z-direction also coincides with a direction of the optical axis OA. The magnetic lenses 402 and 403 are rotationally symmetric with respect to the optical axis OA. A bore 414 is formed inside the first magnetic lens 403 by a radial inner side of the inner pole piece 412. A focusing first electrostatic lens arrangement 450 is disposed inside the bore 414 of the first magnetic lens 403. The first electrostatic lens 450 comprises three electrodes, a first electrode 451, a second electrode 452 and a third electrode 453, which are arranged and configured as an Einzel lens.

In addition, a second electrostatic lens 460 is provided in a region of an upper portion of the bore 414 of the first magnetic lens 403. In analogy to the first electrostatic lens 450, the second electrostatic lens 460 comprises three electrodes 461, 462 and 463 which are arranged and configured as an Einzel lens.

Furthermore, a solenoid coil 470 is disposed in a space between the first magnetic lens 403 and the second magnetic lens 402. The solenoid coil 470 comprises a number of windings of conductive wire wherein the windings are arranged to form a rotationally symmetric bore around the optical axis OA of the lithography system 1.

The particle-optical projection system of the depicted embodiment is designed and operated such that an intermediate image is formed in a lower portion of the second magnetic lens 402. Thus, the first and second electrostatic lenses 450, 460 as well as the solenoid coil 470 are disposed in between the intermediate image and the substrate S.

The lithography system further comprises a main controller MC, and a controller C comprising three control portions C1, C2, and C3.

The first control portion C1 is configured to adjust a beam energy of the electron beam within the first magnetic lens 403 using an electrostatic field generated by the first electrostatic lens 450 (Einzel lens) in the magnetic field generated by the first magnetic lens 403 in a region of the lowermost ends 411' and 412' of the inner and outer pole pieces 411, 412, for instance by effecting a change of a potential difference between the electrodes 451, 452, 453, and thus the focusing power of the first electrostatic lens, for example via a control command to an adjustable power supply configured to supply different potentials to the first electrostatic lens 450. The focusing power is adjusted in response to a signal indicative of the distance of the substrate S from a lowermost portion of the first magnetic lens 403, which is an outer side of radial inner end 411' of the outer pole piece 411, which outer side faces the substrate S. The lithography system 1 further comprises a distance measuring system 500 configured to measure the distance between the substrate S and said outer side of the radial inner end 411' of the outer pole piece 411 of the first magnetic lens 403. The reference sign "ZD" in FIG. 2 indicates the distance between the substrate surface and the outer side of the inner radial end 411' of the outer pole piece 411. A signal indicative of the measured distance is supplied to the controller having the first control portion C1, which adjusts the focusing power of the first electrostatic lens 450 in response to the received signal, if necessary. In particular, the focusing power of the first electrostatic lens 450 is adjusted by the first control portion C1 such that the distance between the outer side of the lowermost end 411' of the outer pole piece 411 and the image of the intermediate image (z-position) is adjusted in a way that it matches the distance ZD between the substrate and the outer side of the lowermost end 411' of the outer pole piece 411 (z-displacement) as closely as possible.

The first electrostatic lens 450 and hence the first control portion C1 do not only influence the position of the image, but also the imaging magnification and the image rotation, or more precisely the rotation angle, of the particle-optical projection system. Said influence may be suitably compensated and corrected for by the second electrostatic lens 460 and the solenoid coil 470, and thus control portions C2 and C3, as outlined below.

The second control portion C2 is configured to adjust a focusing power of the second electrostatic lens 460 based on a signal indicative of an imaging magnification, with the imaging magnification indicating a size of the pattern imaged onto the substrate in relation to the size of the pattern being imaged.

The third control portion C3 is configured to control an excitation current supplied to the solenoid coil 470 based on a signal indicative of an image rotation.

The control portions C1 through C3, the distance measurement system 500 and the main controller MC are interconnected such as to be able to exchange signals between them. The interconnection as schematically shown in FIG. 2 is merely illustrative, said components may also be interconnected in any other suitable manner.

In the depicted embodiment, the signal indicative of the distance between the outer side of the lowermost end 411' of the outer pole piece 411 and the image of the intermediate image (z-position) is provided to the first control portion C1 directly from the distance measurement system 500. The signal indicative of the imaging magnification comprises a first signal portion provided by the main controller MC, which reflects a basic setting of the lithography system, and a second signal portion provided by the first and third control portions C1 and C3, reflecting an influence exerted by these on the imaging magnification. The signal indicative of the rotation comprises a first signal portion provided by the main controller MC, which reflects a rotation induced by a basic setting of the lithography system, and a second signal portion provided by the first and second control portions C1 and C2, reflecting an influence exerted by these on the rotation. The signals received by the control portions C1 through C3 are processed and converted to suitable control signals for adjusting the settings and thus focusing powers or the excitation current, respectively, of the first and second electrostatic lenses and the solenoid coil, respectively.

Figure 3:
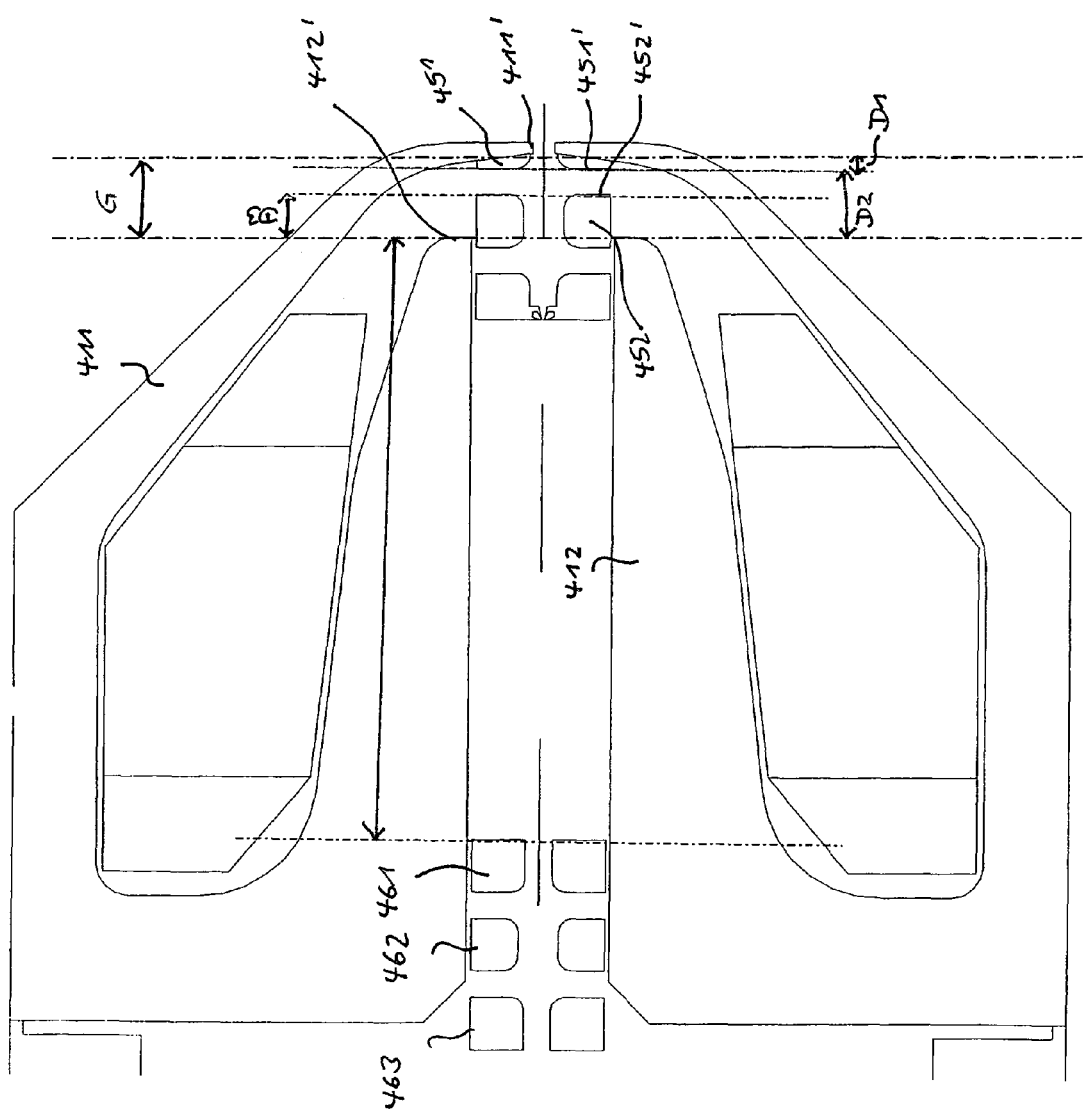
FIG. 3 illustrates a detail of FIG. 2.

In FIG. 3, an enlarged view of the first magnetic lens 403 is depicted, in which distances between various components are illustrated. FIG. 3 shows that a surface 451' of the first electrode 451 facing the second electrode 452 is disposed at a first distance D1 from the lowermost end 412' of the inner pole piece 412 and at a second distance D2 from the radial inner end 411' of the outer pole piece 411 of the first magnetic lens 403 which first and second distances D1, D2 are smaller than the distance G between the lowermost end 412' and the radial inner end 411' of the respective pole pieces 411, 412.

FIG. 3 also shows that a surface 452' of the second electrode 452 facing the first electrode 451 is disposed at a third distance D3 from the lowermost end 412' of the inner electrode 412 which is smaller than the distance G between the lowermost end 412' and the radial inner end 411'. FIGS. 2 and 3 further show that all three electrodes 451, 452, 453 of the first electrostatic lens 450 are disposed in the bore 414 of the first magnetic lens 403 and thus have a greater distance from the substrate S than the lowermost portion, i.e. radial inner end 411', of the outer pole piece 411 of the first magnetic lens 403.

In FIG. 3, it can also be seen that all electrodes 461, 462, 463 of the second electrostatic lens 460 are spaced at least a distance D4 apart from the lowermost end 411' of the inner pole piece 411, with D4 being greater than 2 mm.

In the following, a number of examples is given to show how a predetermined voltage applied to the first and/or the second electrostatic lens and/or a predetermined excitation current applied to the solenoid coil may affect the factors rotation, z-position and imaging magnification.

Modeling of the date given in Table 1 was based on a lithography system as depicted in FIGS. 1 to 3. The numbers given in Table 1 are merely for purpose of illustration and shall not be regarded as limiting the scope of the invention in any way.

In column 1 of Table 1, it is indicated which correction element, i.e. solenoid coil, first electrostatic lens, second electrostatic lens, was operated, in particular to which correction element an excitation current or potential, respectively, was applied to. In Example 1, an effect of the solenoid coil only was studied. In Example 2, an effect of the second electrostatic lens only was studied and in Example 3 an effect of the second electrostatic lens only was studied. In Examples 4 to 6, effects of simultaneously operating all three correction elements was studied. In column 2 of Table 1, the voltage (in units of Volts) or excitation current (in units of Ampereturns) applied is indicated, in column 3 of Table 2, a resulting change in the z-position ($\Delta Z$) is indicated; in column 4, a resulting change in the imaging magnification is given and in column 5, a resulting change in the rotation is given, with the changes referring to the respective parameter when none of these three correction elements are provided or operated. For the change or shift of the z-position, or position of the image along the optical axis, "−" indicates a position which is relatively closer to the pattern defining structure and "+" indicates a position which is relatively further away from the pattern defining structure. The data given in Table 1 were obtained by a numerical simulation of a particle-optical projection system comprising a first and a second magnetic lens in the particle-optical projection system and using a blanking aperture array as a pattern defining structure, as mentioned above. Values forming the basis for the simulation are as follows: Imaging magnification: 1/200; image rotation with respect to the blanking aperture array: −0.542 deg and image z-position 414.135 mm, as measured from a lowermost end of the blanking aperture array.

TABLE 1

| Correction element | Voltage [V] or Excitation [Ampereturns] | $\Delta Z$ [μm] | $\Delta$Magnification | $\Delta$Rotation |
|---|---|---|---|---|
| Ex. 1 | | | | |
| Solenoid coil | 4 Ampereturns | 0 | −6 ppm (<1 nm) | −0.131° (167 nm) |
| Ex. 2 | | | | |
| Second electrostatic lens | −2 kV | −1 | +1259 ppm (92 nm) | 0.000° |

TABLE 1-continued

| Correction element | Voltage [V] or Excitation [Ampereturns] | ΔZ [μm] | ΔMagnification | ΔRotation |
|---|---|---|---|---|
| Ex. 3 | | | | |
| First electrostatic lens | −500 V | −29 | −3056 ppm (−223 nm) | −0.115° (146 nm) |
| Ex. 4 | | | | |
| Solenoid coil | −3.511 Ampereturns | −31 | +29 ppm (~2 nm) | −0.002° (2.5 nm) |
| Second electrostatic lens | −3.423 kv | | | |
| First electrostatic lens | −500 V | | | |
| Ex. 5 | | | | |
| Solenoid coil | −7.124 Ampereturns | −61 | −10 ppm (<1 nm) | 0.000° |
| Second electrostatic lens | −5.014 kv | | | |
| First electrostatic lens | −1000 V | | | |
| Ex. 6 | | | | |
| Solenoid coil | −16.96 Ampereturns | 0 | +11 ppm (<1 nm) | +0.547° (697 nm correction of rotation of optics) |
| Second electrostatic lens | −131 V | | | |
| First electrostatic lens | +24.6 V | | | |

Figure 4:
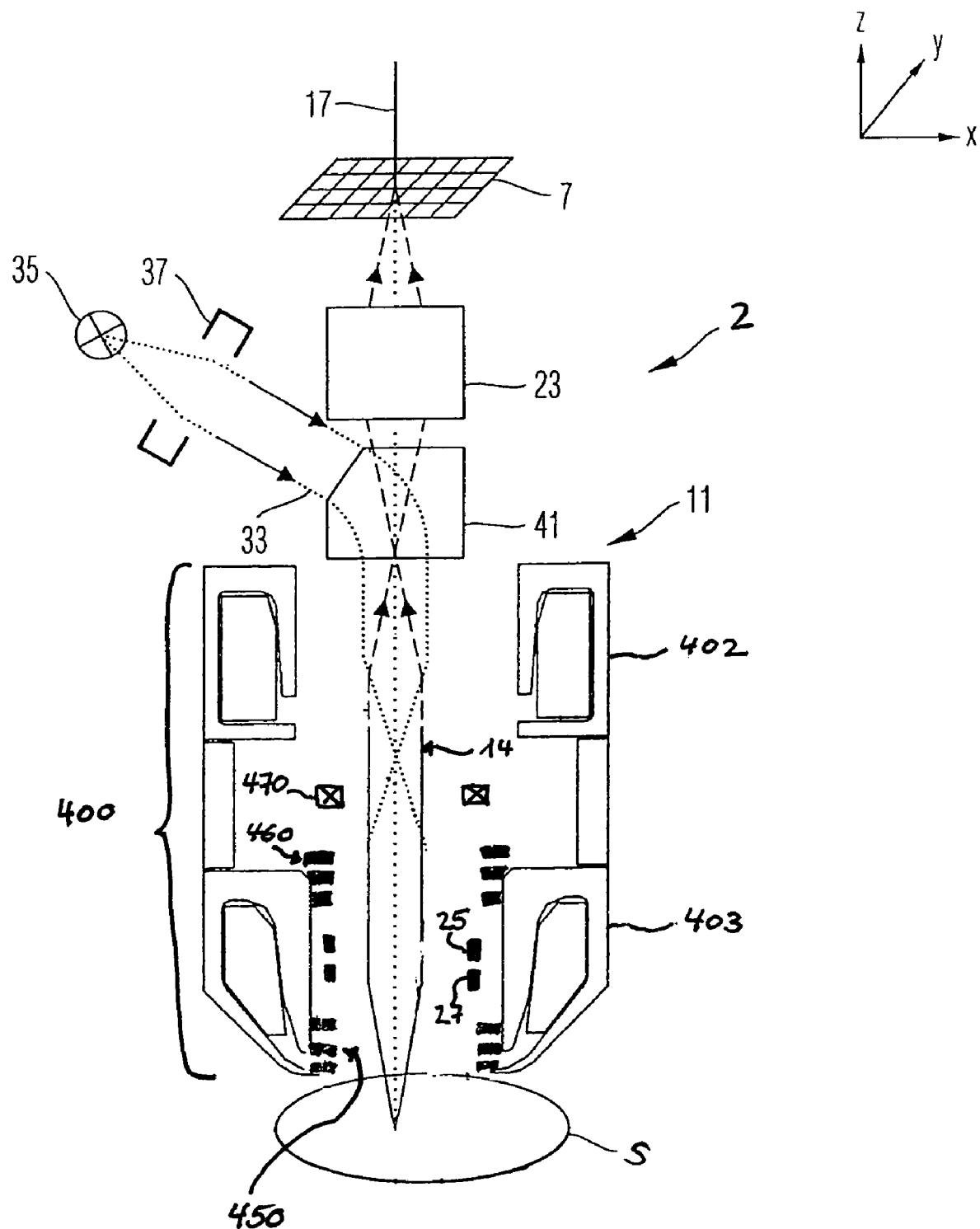
FIG. 4 illustrates an embodiment of an inspection system comprising the projection system illustrated in FIGS. 2 and 3.

FIG. 4 schematically shows an inspection system which is configured as an electron microscopy system 2. It is used to image a substrate S positioned in an object plane of the microscopy system 2 onto a position-sensitive detector 7. To this end, the microscopy system 2 comprises a microscopy optics 11, which comprises the projection system 400 and which provides a beam path for secondary electrons in order to electron-optically image a region of the substrate S onto the detector 7. The region 13 which is imaged onto the detector 7 is generally displaceable with respect to an optical axis 17 of the microscopy optics 11 (displacement not illustrated; for details of the replacement it is referred to US 2004/0084621 A1, the entire contents of which is incorporated by reference herein).

The secondary electrons emanating from the substrate S form a secondary electron beam 14 which is supplied to the detector 7 by the microscopy optics 11. The projection system used to this end has already been described in detail with reference to the preceding Figures. In a bore formed within the first magnetic lens 403, two beam deflectors 25 and 27 are arranged such that they are spaced apart from each other along the optical axis 17 (which corresponds largely to the main axis in the preceding Figures). They are controlled by a controller (controller and connections thereto not shown for ease of illustration) to provide adjustable deflection angles for the secondary electron beam 14. In other embodiments, the deflectors 25, 27 may be arranged in a different position in the projection system, for instance upstream of the first magnetic lens, between the first and second magnetic lenses or elsewhere.

The secondary electrons are released from the substrate S by a primary electron beam 33 which is generated by an electron source 35, collimated by a collimating lens 37, shaped by an aperture stop 39 and supplied to a beam splitter/combiner 41. The beam splitter/combiner 41 superimposes a beam path of the primary electron beam 33 with a beam path of the secondary electron beam 14. The primary electron beam 33 passes also through projection system 400 including the beam deflectors 25, 27. The primary electron beam 33 is also deflected by the deflectors 25, 27, but not necessarily to the same extent as the secondary electron beam 14. Rather, it is sufficient for the primary electron beam 33 to illuminate a region of the substrate S which is imaged on the detector 7 in a fairly broad, homogeneous manner.

As can be seen from FIG. 4, an intermediate image of the electron source 35, i.e. an intermediate image in the primary beam path is formed at about the same position where reference numeral 14 designates the secondary beam, whereas an intermediate image of a point on the surface of the substrate S in the secondary electron beam is formed at a position of entry of the secondary beam into the beam splitter 41.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as defined in the following claims.

What is claimed is:

1. A charged particle inspection system, comprising:
   at least one charged particle source for generating one or more beams of charged particles;
   a focusing first magnetic lens having a main axis and comprising an outer pole piece and an inner pole piece, the focusing first magnetic lens having a focusing power;
   a focusing first electrostatic lens having at least a first electrode and a second electrode spaced apart in a direction of said main axis, said focusing first electrostatic lens having a focusing power;
   a substrate mount configured to hold a substrate to be inspected relative to the first magnetic lens and the first electrostatic lens, wherein the one or more beams of charged particles are focused onto the substrate by a combination of the focusing power of the first magnetic lens and the focusing power of the first electrostatic lens; and a controller having a first control portion configured to control the focusing power of the first focusing electrostatic lens based on a signal indicative of a distance between the lowermost end of said focusing magnetic lens disposed closest to the substrate and a region of the substrate onto which the one or more beams are focused, wherein the controller is configured to dynamically adjust the focusing power of the focusing first electrostatic lens a plurality of times during inspection of the substrate.

2. The charged particle inspection system according to claim 1, further comprising a distance measuring system configured to generate the signal indicative of the distance of the surface of the substrate based on a distance measurement of the distance of the surface of the substrate from a portion of the first magnetic lens.

3. The charged particle inspection system according to claim 1, wherein the first control portion is configured to generate the signal indicative of the distance between the lowermost end of said focusing magnetic lens and the region of the substrate onto which the one or more beams are focused based on data representing a map of a surface of the substrate.

4. The charged particle inspection system according to claim 1, wherein the first electrostatic lens comprises a third electrode spaced apart from the first and second electrodes.

5. The charged particle inspection system according to claim 4, wherein the first electrostatic lens is configured as an Einzel lens.

6. The charged particle inspection system according to claim 1, further comprising a detector configured to detect sedondary charged particles emitted by the substrate as a result of the one or more beams of charged particles focused on the substrate.

7. The charged particle inspection system according to claim 6, wherein the substrate mount is configured to displace the substrate to be inspected relative to the first magnetic lens, the first electrostatic lens and the detector.

8. The charged particle inspection system according to claim 1, further comprising a solenoid coil disposed about the main axis of the first magnetic lens and upstream of the first magnetic lens.

9. The charged particle inspection system according to claim 8, further comprising a second magnetic lens disposed upstream of the first magnetic lens, wherein said solenoid coil is interposed between the first and second magnetic lenses.

10. The charged particle inspection system according to claim 8, wherein the controller further comprises a third control portion configured to control an excitation current applied to the solenoid coil based on a signal indicative of a rotation of the one or more beams of charged particles.

11. A method of inspecting a substrate using a charged particle system, the method comprising:
    generating one or more beams of charged particles with at least one charged particle source;
    providing a first focusing power by operating a focusing first magnetic lens having a main axis and comprising an outer pole piece and an inner pole piece;
    providing a second focusing power by operating a focusing first electrostatic lens having at least a first electrode and a second electrode spaced apart in a direction of said main axis;
    focusing the one or more beams of charged particles onto the substrate in a region of the substrate currently being inspected using a combination of the first focusing power and the second focusing power;
    generating a signal indicative of a distance between a lowermost end of the first magnetic lens disposed closest to the substrate and the region of the substrate currently being inspected; and
    dynamically adjusting the second focusing power plural times during inspection of the substrate based on the signal indicative of the distance.

12. The method according to claim 11, wherein the signal indicative of the distance is generated based on data representing a map of a surface of the object.

13. The method according to claim 12, wherein data representing the map of the surface of the object is obtained from the substrate before inspection of the substrate.

14. The method according to claim 11, wherein the signal indicative of the distance is generated based on a distance measurement.

15. The method according to claim 11, further comprising measuring the distance between the lowermost end of the first magnetic lens and the region of the substrate currently being inspected.

16. The method according to claim 11, further comprising detecting secondary charged particles emitted by the substrate as a result of the one or more beams of charged particles focused on the substrate.

17. The method according to claim 16, further comprising displacing the substrate relative to the one or more beams focused onto the substrate.

18. The method according to claim 11, further comprising operating a solenoid coil disposed about the main axis of the first magnetic lens and upstream of the first magnetic lens.

19. The method according to claim 18, further comprising controlling an excitation current applied to the solenoid coil based on a signal indicative of a rotation of the one or more beams of charged particles.

* * * * *